United States Patent
Akselrod et al.

(10) Patent No.: US 7,520,046 B2
(45) Date of Patent: Apr. 21, 2009

(54) METHOD AND ARTICLE OF MANUFACTURING FOR DESIGNING A TRANSFORMER

(75) Inventors: Arkady Akselrod, Santa Clara, CA (US); Sameer Kelkar, Santa Clara, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 11/827,454

(22) Filed: Jul. 11, 2007

(65) Prior Publication Data

US 2007/0257656 A1    Nov. 8, 2007

Related U.S. Application Data

(63) Continuation of application No. 10/990,245, filed on Nov. 16, 2004, now Pat. No. 7,373,714.

(51) Int. Cl.
*H01F 7/06* (2006.01)
*G05F 1/12* (2006.01)

(52) U.S. Cl. .................................... 29/602.1

(58) Field of Classification Search ............... 323/355, 323/356, 358, 359; 336/65, 84 R, 84 C, 170, 336/171, 188, 222; 29/602.1, 604–606
See application file for complete search history.

(56) References Cited

U.S. PATENT DOCUMENTS

| 4,982,498 | A | 1/1991 | Umezaki |
| 5,124,681 | A | 6/1992 | Chen |
| 5,572,435 | A | 11/1996 | Kaltenecker |
| 5,946,210 | A | 8/1999 | Montminy et al. |
| 6,191,673 | B1 * | 2/2001 | Ogura et al. ............... 336/84 R |
| 6,507,131 | B1 * | 1/2003 | Malfroy et al. .............. 307/104 |
| 6,549,431 | B2 | 4/2003 | Odell et al. |
| 6,914,508 | B2 | 7/2005 | Ferencz et al. |

(Continued)

FOREIGN PATENT DOCUMENTS

EP    0 803 964 A2    10/1997

(Continued)

OTHER PUBLICATIONS

PCT/US2005/041462, Apr. 4, 2006, International Search Report.

(Continued)

*Primary Examiner*—Matthew V Nguyen
(74) *Attorney, Agent, or Firm*—Blakely Sokoloff Taylor & Zafman LLP

(57) ABSTRACT

Various techniques directed to the design and construction of transformers are disclosed. In one aspect, a computer system according to embodiments of the present invention includes instructions stored on a storage media which when executed by a processor performs the operations of loading parameters of a transformer included in a power supply design, calculating primary winding parameters of the transformer in response to the loaded parameters of the transformer, calculating secondary winding parameters of the transformer in response to the loaded parameters of the transformer, and generating a list of transformer construction materials. Shield winding parameters of the transformer may be calculated in response to the loaded parameters of the transformer. The calculation of secondary winding parameters may include allocating pins of a secondary winding of the transformer.

35 Claims, 12 Drawing Sheets

U.S. PATENT DOCUMENTS

| | | | |
|---|---|---|---|
| 6,967,556 | B2 | 11/2005 | Gaschke et al. |
| 6,982,621 | B2 | 1/2006 | Park |
| 7,119,647 | B2 | 10/2006 | Park |
| 7,167,068 | B2 * | 1/2007 | Nakano et al. .............. 336/120 |

FOREIGN PATENT DOCUMENTS

| | | |
|---|---|---|
| EP | 0 825 699 A2 | 2/1998 |
| JP | 0 1243852 | 9/1989 |
| WO | WO 02/50987 A1 | 6/2002 |

OTHER PUBLICATIONS

"TOPSwitch® Flyback Transformer Construction Guide," Power Integrations, Inc. 477 N. Mathilda Avenue, Sunnyvale, CA 94086 (Jul. 1996), pp. 1-32.

"New PI Expert™ SMPS Software from Power Integrations Shortens Design Time; Suite 5.0 Simplifies SMPS Designs Between 1 and 200 Watts," Power Integrations, Inc., San Jose, California, (Mar. 11, 2004) (last modified: Aug. 13, 2004).

"*Design Software*," Power Integrations, Inc., pp. 1-2, http://www.powerint.com./designsoftwareframe.htm, Sep. 22, 2004.

"*PI Expert FAQ*," Power Integrations, Inc., pp. 1-9, http://www.powerint.com/piexpertfaqframe.htm, Sep. 22, 2004.

"*Design Center*," Fairchild Semiconductor®, p. 1, http://www.fairchildsemin.com/designcenter/index.htm, Nov. 16, 2004 (last updated Oct. 19, 2004).

"*Power.National.Com*," National Semiconductor, pp. 1-3, http://www.national.com/appinfo/power, Nov. 16, 2004.

"*VIPer® Family*," STMicroelectronics, p. 1, http://www.st.com/stonline/prodpres/discrete/vipower.vipfm5.htm, Nov. 16, 2004.

Horstkotte, R., "Sperrwandler-Berechnung Beispiel Einer MathCAD-Anwendung," Elektronik, Weka Fachzeitschriftenverlag, Poing, DE, Apr. 27, 1990, vol. 39, No. 9, pp. 167-171.

Lau, B., "Computer-aided design of a DC-to-DC switching converter," APEC '90. Fifth Annual Applied Power Electronics Conference and Exposition. Conference Proceedings. Mar. 11, 1990, pp. 619-628, Los Angeles, CA, USA.

Urling, A. M. et al., "Characterizing high-frequency effects in transformer windings—a guide to several significant articles." APEC '89. Fourth Annual IEEE Applied Power and Electronics Conference and Exposition. Conference Proceedings 1989, Mar. 13, 1989, pp. 373-385, Baltimore, MD, USA.

Coonrod, N.R., "Transformer Computer Deisgn Aid for Higher Frequency Switching Power Supplies." IEEE Transactions on Power Electronics, Oct. 4, 1986, vol. PE-1, No. 4, USA, pp. 248-256.

STMicroelectronics, VIPer Support: Design Software [website] (visited Jan. 24, 2007) <http://www.st.com/stonline/products/families/power_management/ac_dc_conversion/high_voltage_converters/related_info/vipfm5.htm#p2>, 1 page.

National Semiconductor Corporation, Design Software for Simple Switcher DC-DC Converters [website] (visited Jan. 24, 2007) <http://www.national.com/appinfo/power/0,1768,383,00.html>, 2 pages.

Linear Technology, Design Simulation and Device Models-LTSPICE/SWITCHERCAD III [website] (visited Jan. 24, 2007) <http://www.linear.com/company/software.jsp>, 2 pages.

Fairchild Semiconductor, Offline Switching Mode Power Supply (SMPS) Design Tools [website] (visited Jan. 24, 2007) <http://www.fairchildsemi.com/whats_new/offline_smps_toolkit.htm>, 2 pages.

* cited by examiner

FIG. 2

Transformer Construction

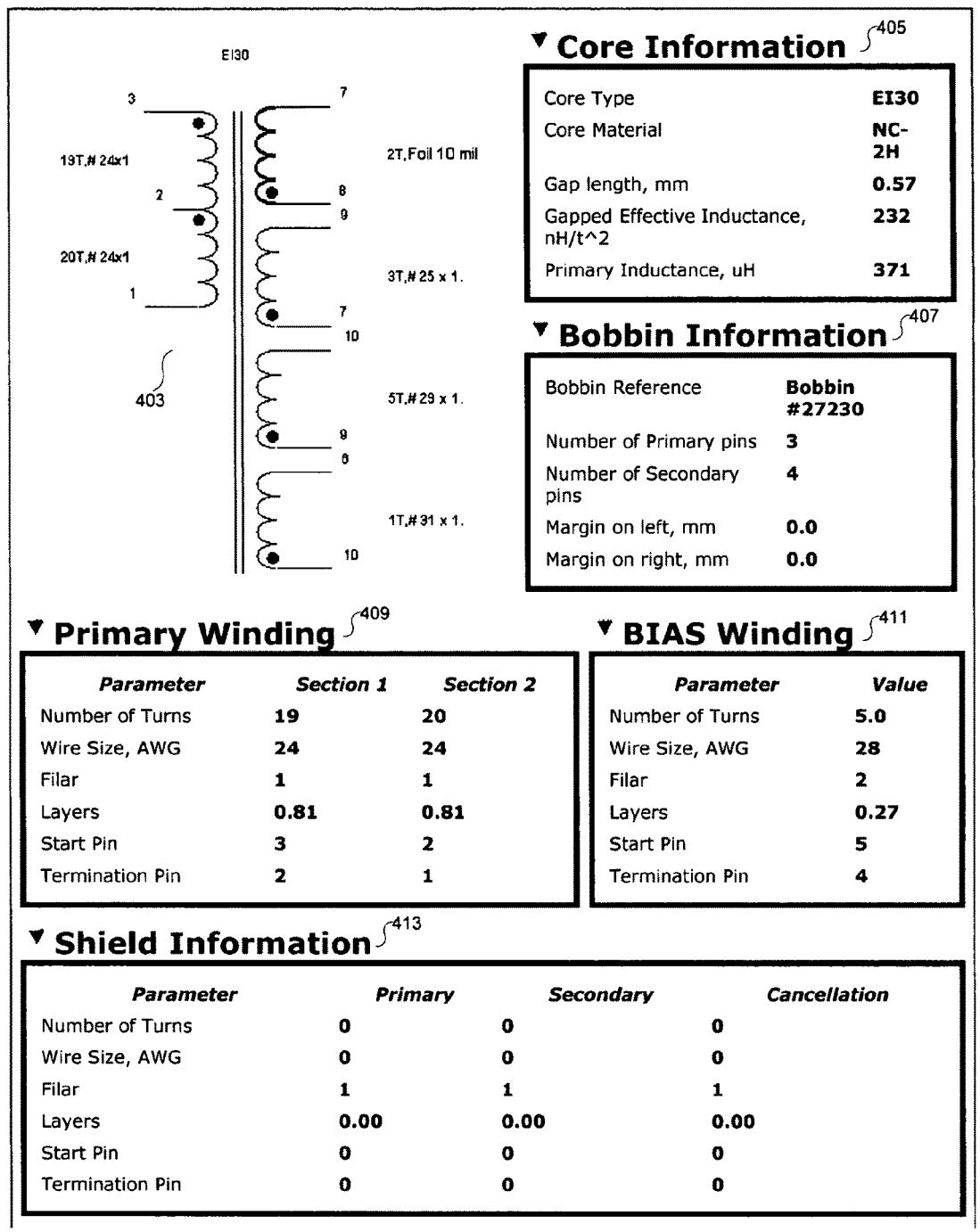

Core Information

| | |
|---|---|
| Core Type | EI30 |
| Core Material | NC-2H |
| Gap length, mm | 0.57 |
| Gapped Effective Inductance, nH/t^2 | 232 |
| Primary Inductance, uH | 371 |

Bobbin Information

| | |
|---|---|
| Bobbin Reference | Bobbin #27230 |
| Number of Primary pins | 3 |
| Number of Secondary pins | 4 |
| Margin on left, mm | 0.0 |
| Margin on right, mm | 0.0 |

Primary Winding

| Parameter | Section 1 | Section 2 |
|---|---|---|
| Number of Turns | 19 | 20 |
| Wire Size, AWG | 24 | 24 |
| Filar | 1 | 1 |
| Layers | 0.81 | 0.81 |
| Start Pin | 3 | 2 |
| Termination Pin | 2 | 1 |

BIAS Winding

| Parameter | Value |
|---|---|
| Number of Turns | 5.0 |
| Wire Size, AWG | 28 |
| Filar | 2 |
| Layers | 0.27 |
| Start Pin | 5 |
| Termination Pin | 4 |

Shield Information

| Parameter | Primary | Secondary | Cancellation |
|---|---|---|---|
| Number of Turns | 0 | 0 | 0 |
| Wire Size, AWG | 0 | 0 | 0 |
| Filar | 1 | 1 | 1 |
| Layers | 0.00 | 0.00 | 0.00 |
| Start Pin | 0 | 0 | 0 |
| Termination Pin | 0 | 0 | 0 |

FIG. 4

▼ Secondary Winding /515

| Parameter | Output 1 | Output 2 (main) | Output 3 | Output 4 |
|---|---|---|---|---|
| Actual Voltage, V | 5.00 | 12.00 | 27.00 | 30.00 |
| Number of Turns | 2 | 3 | 5 | 1 |
| AWG_SEC / Foil | 10 | 25 | 29 | 31 |
| Filar | 0 | 1 | 1 | 1 |
| Layers | 2.00 | 0.11 | 0.12 | 0.02 |
| Start Pin | 7 | 9 | 10 | 6 |
| Termination Pin | 8 | 7 | 9 | 10 |

▼ Winding Instruction /517

*Primary Section 1*

Start on pin 3 and wind 19 turns of item [5] in 1.00 layer(s).

On the final layer, spread the winding evenly across entire bobbin.

Finish winding on pin 2.

Add 1 layer of item [3] for insulation.

*Bias Winding*

Start on pin 5 and wind 5.0 turns (x 2 filar) of item [6]. Spread the winding evenly across entire bobbin.

Finish on pin 4.

Add 3 layers of item [3] for insulation.

*Secondary Winding*

Start on pin 7 and wind 2 turns of item [7]. Spread the winding evenly across entire bobbin. Finish on pin 8.

Start on pin 9 and wind 3 turns (x 1 filar) of item [8]. Spread the winding evenly across entire bobbin. Finish on pin 7.

Start on pin 10 and wind 5 turns (x 1 filar) of item [9]. Spread the winding evenly across entire bobbin. Finish on pin 9.

Start on pin 6 and wind 1 turns (x 1 filar) of item [10]. Spread the winding evenly across entire bobbin. Finish on pin 10.

Add 2 layers of item [3] for insulation.

*Primary Section 2*

Start on pin 3 and wind 19 turns of item [5] in 1.00 layer(s).

On the final layer, spread the winding evenly across entire bobbin.

Finish winding on pin 2.

Add 1 layer of item [3] for insulation.

*Core Assembly*

Assemble and secure core halves. Item [1]

*Varnish*

Dip varnish uniformly in item [4]. Do not vacuum impregnate.

▼ Comments ⌐619

1. Use of a grounded flux-band around the core may improve the EMI performance.
2. For non margin wound transformers use triple insulated wire for all secondary windings.

▼ Materials ⌐621

| Item | Description |
|---|---|
| [1] | Core: EI30, NC-2H, gapped for ALG of 232 nH/t^2 |
| [2] | Bobbin: |
| [3] | Tape: Polyester film 13.70 mm wide |
| [4] | Varnish |
| [5] | Magnet Wire: 24 AWG, Solderable Double Coated |
| [6] | Magnet Wire: 28 AWG, Solderable Double Coated |
| [7] | Copper Foil - 10 mils thick, 13.70 mm wide |
| [8] | Triple Insulated Wire: 25 AWG |
| [9] | Triple Insulated Wire: 29 AWG |
| [10] | Triple Insulated Wire: 31 AWG |

▼ Electrical Test Specifications ⌐623

| Parameter | Condition | Spec |
|---|---|---|
| Electrical Strength, VAC | 60 Hz 1 minute, from pins 1 - 2 to pins 6 - 8. | 3000 |
| Primary Inductance, uH | Measured between Pin 1 to Pin 2, with all other Windings open. Value is a minimum. | 227 +/- 10% |
| Primary Leakage, uH | Measured between Pin 1 to Pin 2, with all other Windings shorted. Value is a maximum. | 23 (max) |

FIG. 6

METHOD AND ARTICLE OF MANUFACTURING FOR DESIGNING A TRANSFORMER

REFERENCE TO PRIOR APPLICATION

This application is a continuation of and claims priority to U.S. application Ser. No. 10/990,245, filed Nov. 16, 2004, now pending.

BACKGROUND

1. Technical Field

Embodiments of the invention relate generally to the design of circuits, and more specifically, to the design of a transformer construction in power supply.

2. Background Information

Power supplies are used to provide power to electronic devices to enable the electronic devices to operate. Power supplies can come in a variety of designs, depending on the needs of the electronic devices. Sometimes the electronic devices are powered directly from the power supplies and sometimes the electronic devices are powered from batteries, which are charged by the power supplies.

One of the items often included in power supplies is a transformer. A voltage is usually applied to the transformer from one part of the power supply circuit (often referred to as the primary) and the transformer transfers energy from that part of the power supply circuitry to another part of the power supply circuitry (often referred to as the secondary). The transformer provides the electrical isolation and also shifts the voltage level between the primary and secondary.

The design and construction of power supplies as well as the transformers that are used in the power supplies can be a very complicated and complex task due to many factors and variables. The complexity is further increased if transformer shielding is to be added to the construction process. For example, the design and construction of transformers is often done through experimentation, on a trial and error basis in order for the power supply designer to realize a power supply having the desired specifications with regard to electrical and electromagnetic interference (EMI) performance.

BRIEF DESCRIPTION OF THE DRAWINGS

The present invention detailed illustrated by way of example and not limitation in the accompanying Figures.

FIG. 2 is diagram illustrating an embodiment of design results of a power supply design including an embodiment of a transformer design that is generated by an embodiment of a power supply software design tool run on a computer in accordance with the teachings of the present invention.

FIG. 4 is a diagram illustrating an embodiment of the output of an embodiment of a transformer construction design tool in accordance with the teachings of the present invention.

FIG. 5 is a diagram illustrating an embodiment of additional output of an embodiment of a transformer construction design tool in accordance with the teachings of the present invention.

FIG. 6 is a diagram illustrating an embodiment of still more of the output of an embodiment of a transformer construction design tool in accordance with the teachings of the present invention.

DETAILED DESCRIPTION

Embodiments of a transformer construction design tool that may be integrated with a power supply design tool are disclosed. In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
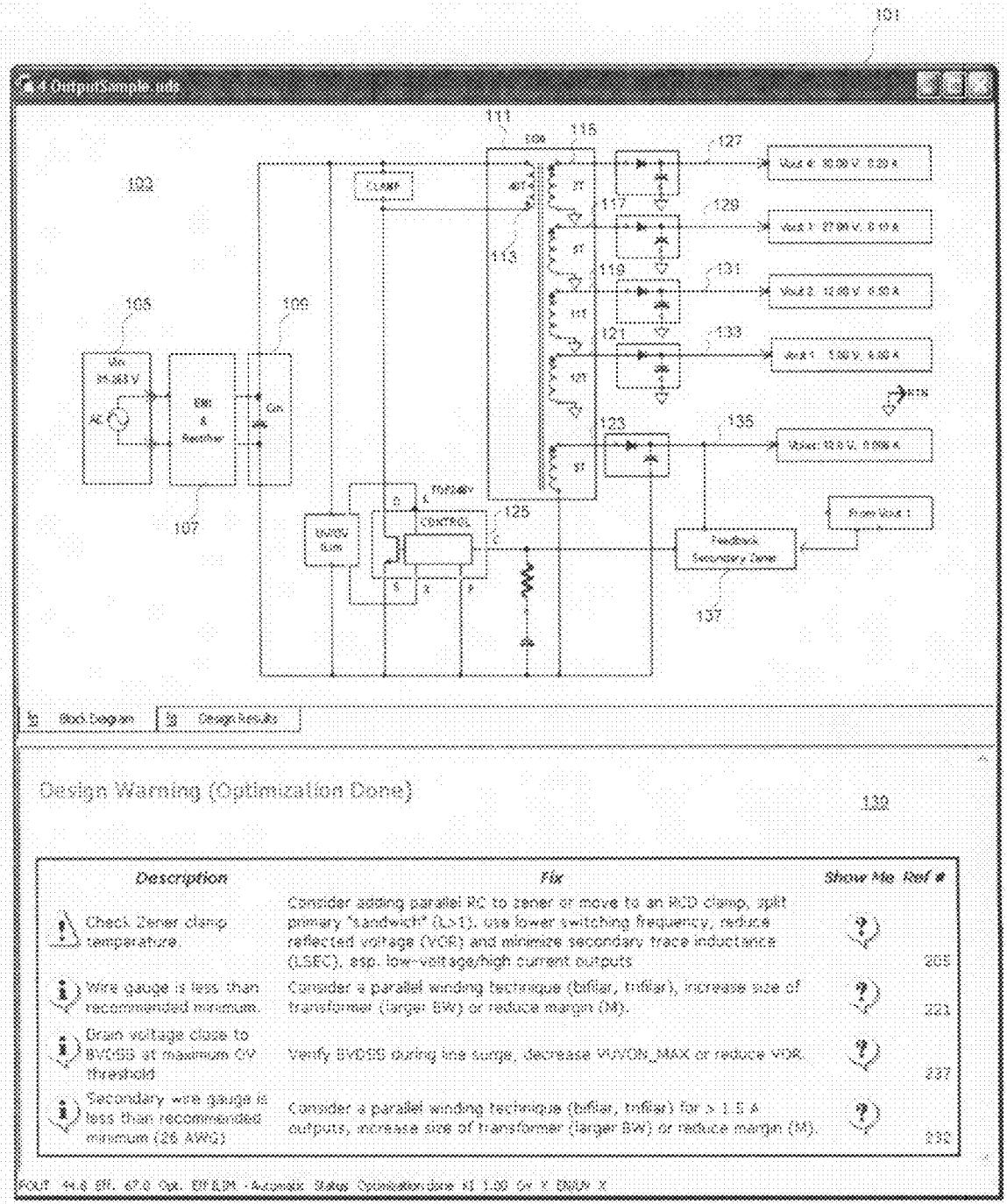
FIG. 1 is a diagram illustrating an embodiment of a block diagram of power supply design including an embodiment of a transformer design that is generated by an embodiment of a power supply software design tool run on a computer in accordance with the teachings of the present invention.

FIG. 1 is a diagram illustrating an embodiment an output 101 generated by power supply design tool including a transformer design tool in accordance with the teachings of the present invention. In one embodiment, output 101 may be a report generated by a computer program such as for example PI Expert™ power supply design software from Power Integrations of San Jose, Calif. In other embodiments, it is appreciated that other programs may be utilized to generate a report similar to output 101 in accordance with the teachings of the present invention.

As shown in the depicted embodiment, output 101 includes an example block diagram of an example designed power supply 103 with design warnings 139. Design warnings 139 provide a power supply designer with descriptions of potential concerns regarding power supply 103 and possible fixes regarding the potential concerns. In the illustrated example, the "Block Diagram" tab of output 101 is selected, which displays the design of power supply 103. The design of power supply 103 includes a transformer 111, which in the illustrated example includes a primary winding 113, secondary windings 115, 117, 119 and 121, and a bias winding 123. In other transformer designs or embodiments, a different number of windings may be designed in accordance with the teachings of the present invention.

In operation, an alternating current (AC) input voltage Vin is generated from an AC source 105 is rectified with a rectifier circuit 107 and filter capacitor 109. The rectified input voltage Vin is applied to one end of the primary winding 113 of transformer 111. A power supply controller 125 is coupled to the other end of the primary winding 113. In the illustrated embodiment, power supply controller 125 is from the TOP-Switch® family of integrated circuit power supply controllers from Power Integrations of San Jose, Calif. In other embodiments, other power supply controllers may be utilized in power supply designs in accordance with the teachings of the present invention. When operating, power supply controller 125 includes a power switch that is switched on and off to control or regulate the transfer of energy in transformer 111 from the primary winding 113 to the secondary windings 115, 117, 119 and 121, and a bias winding 123. As a result, regulated voltages and/or currents are provided outputs 127, 129, 131, 133 and 135 of power supply 103. In the illustrated embodiment, feedback is provided to power supply controller 125 through feedback/secondary Zener circuitry 137 from bias winding 123 through output 135.

Figure 2:
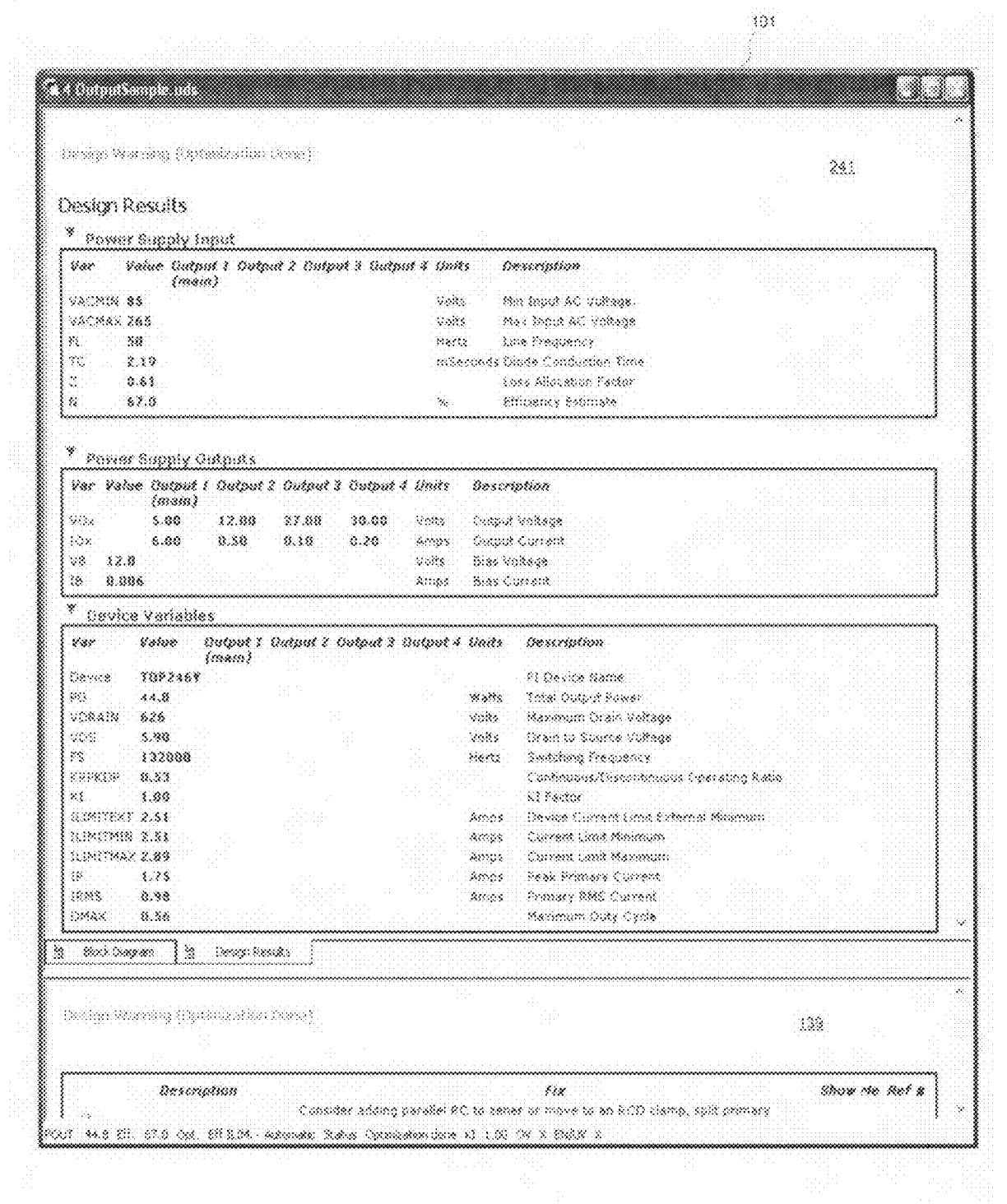

FIG. 2 is diagram that illustrates an example of output 101 generated by a power supply design tool in which the "Design Results" tab is selected. With the "Design Results" tab selected, a design result report 241 corresponding to the design of power supply 103 of FIG. 1 is displayed. As shown in the depicted embodiment, a design result report 241 summarizes various features of the design of power supply 103 including a listing of power supply inputs, power supply outputs, device variables and the like. As illustrated, design result report 241 also provides descriptions as well as other helpful information that will assist a power supply designer when designing a power supply in accordance with the teachings of the present invention.

Figure 3:
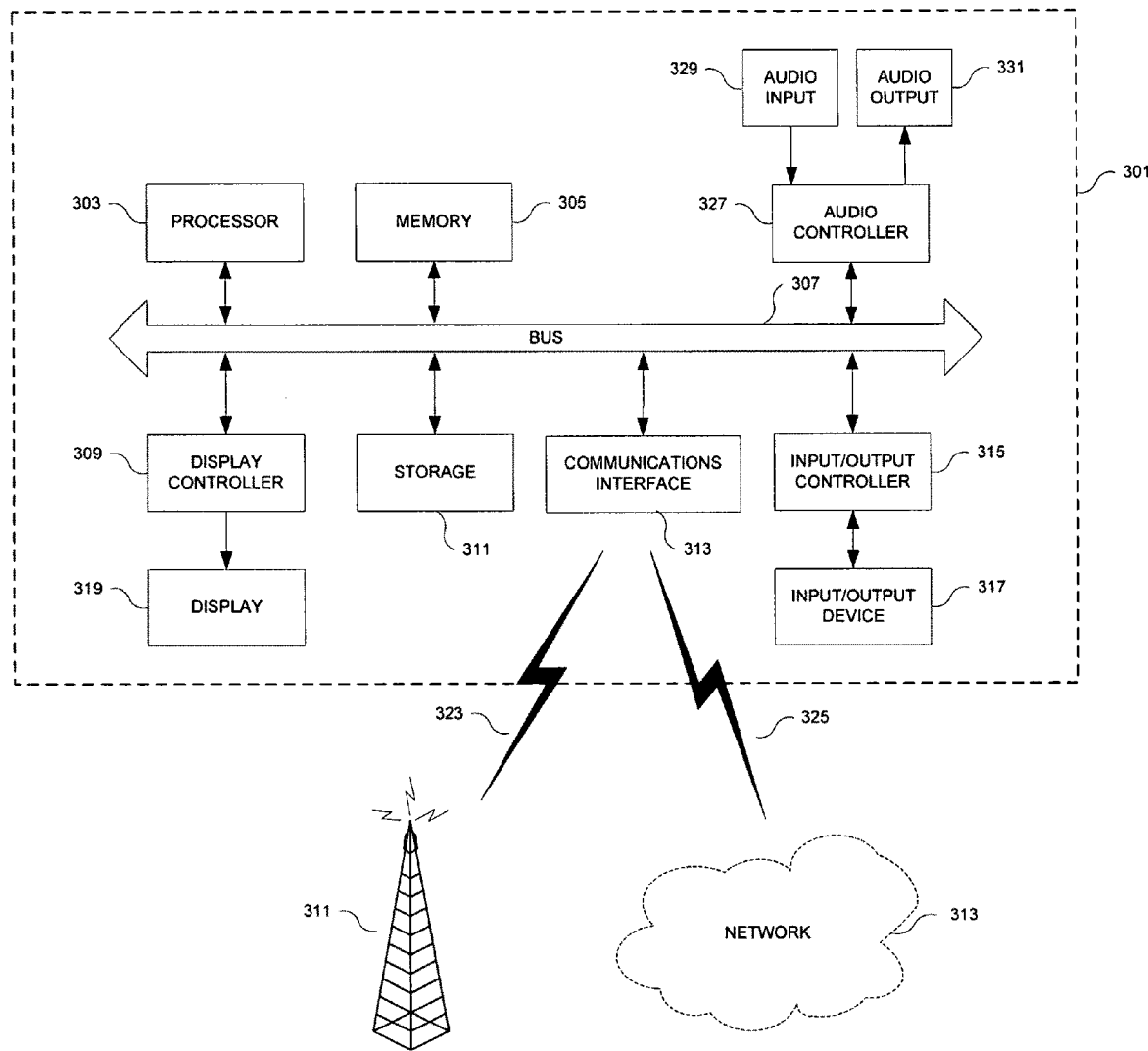
FIG. 3 is a block diagram of one embodiment of a computer system that may be used with an embodiment a power supply design tool and a transformer construction design tool in accordance with the teachings of the present invention.

FIG. 3 is a block diagram illustrating one embodiment of a machine 301, such as for example a personal computer, a personal digital assistant, or any other suitable computing equivalent capable to run software such as for example the power supply design tool including a transformer design tool in accordance with the teachings of the present invention. In one embodiment, machine 301 is a computer that includes a processor 303 coupled to a bus 307. In one embodiment, memory 305, storage 311, display controller 309, communications interface 313, input/output controller 315 and audio controller 327 are also coupled to bus 307.

In one embodiment, machine 301 interfaces to external systems through communications interface 313. Communications interface 313 may include an analog modem, digital modem, a network interface card, a wireless network interface, an optical carrier interface, token ring interface, satellite transmission interface, or any other interfaces for coupling a device to other devices.

In one embodiment, a carrier wave signal 323 is received/transmitted by communications interface 313 to communicate with a wireless antenna 111. In one embodiment, wireless antenna provides a wireless interface to a network 313. In one embodiment, carrier wave signal 325 is received/transmitted by communications interface 313 to communicate with network 113. In one embodiment, communications signals 323 and/or 325 may be used to interface machine 301 with another computer system, a network hub, router or the like. In one embodiment, communications signals 323 and 325 may be considered as carrier-wave signals and are considered to be machine readable media, which may be transmitted through wires, cables, optical fibers or through the atmosphere, or the like.

In one embodiment, processor 303 may be a conventional microprocessor, such as for example but not limited to an Intel x86 or Pentium family microprocessor, a Motorola family microprocessor, or any other suitable equivalent. Memory 305 may be a machine readable medium such as dynamic random access memory (DRAM) and may include static random access memory (SRAM). Display controller 309 controls in a conventional manner a display 319, which in one embodiment may be a cathode ray tube (CRT), a liquid crystal display (LCD), an active matrix display, a plasma display, a projector display, a television monitor or the like. The input/output device 317 coupled to input/output controller 315 may be a keyboard, disk drive, printer, scanner and other input and output devices, including a television remote, mouse, trackball, track pad, joystick, pointing device or the like. In one embodiment, audio controller 327 controls in a conventional manner audio output 331, which may include for example audio speakers, headphones, an audio receiver, amplifier or the like. In one embodiment, controller also controls in a conventional manner audio input 329, which may include for example a microphone or input(s) from an audio or musical device, or the like.

Storage 311 in one embodiment may include machine readable or accessible media such as for example but not limited to a magnetic hard disk, a floppy disk, an optical disk, a flash memory drive, a smart card or any other suitable storage media equivalent for the storage for data. In one embodiment, storage 311 may include removable media, read-only media, readable/writable media or the like. Some of the data may be written by a direct memory access process into memory 305 during execution of software in computer system 301. It is appreciated that software may reside in storage 311, memory 305 or may be transmitted or received via modem or communications interface 313. For the purposes of the specification, the term "machine readable medium" shall be taken to include any medium that is capable of storing data, information or encoding a sequence of instructions for execution by processor 303 to cause processor 303 to perform the methodologies of the present invention. The term "machine readable medium" shall be taken to include, but is not limited to solid-state memories, optical and magnetic disks, carrier wave signals, and the like.

FIG. 4 is a diagram illustrating an embodiment of the output 401 of an embodiment of a transformer construction design tool, which in one embodiment may be integrated with a power supply design tool in accordance with the teachings of the present invention. In one embodiment, the transformer construction design tool is a software tool that may be operated on a computer such as for example machine 301. For example, in one embodiment, the transformer construction design tool software includes instructions, which may be accessed from in storage 311, memory 305 and/or the carrier wave signals of communications signals 323 and/or 325.

When processor 303 accesses the instructions, an embodiment of the transformer construction design tool is executed by machine 301 in accordance with the teachings of the present invention.

In one embodiment, the transformer construction design tool is integrated or may be used with a power supply design tool, such as for example the power supply design tool example described in connection with FIGS. 1 and 2 above. In particular, in one embodiment, the transformer construction design tool provides more detailed information to a power supply designer on how to construct the transformer design included in the design of power supply 103 described above in FIGS. 1 and 2 in accordance with the teachings of the present invention. In one embodiment, the information regarding the design of power supply 103 may be provided as input to the transformer construction design tool through a data file stored locally on machine 301 in storage 311, or remotely in a network storage device accessed through communications interface 313 in accordance with the teachings of the present invention. In one embodiment, the information regarding the design of power supply 103 may be provided as input to the transformer construction design tool through an input/output device 317 to machine 301 through input/output controller 315 in accordance with the teachings of the present invention.

To illustrate, output 401 includes a diagram 403 of a transformer to be constructed in accordance with the teachings of the present invention. In one embodiment, output 401 may be output as on display, such as for example display 319, or output may be printed on a printer connected to machine 301 through for example communications interface 313 or input/output controller 315 or the like. In one embodiment, the information of output 401 may be stored for example in a file stored in a local hard drive such as for example storage 311, or for example a network storage device accessed via communications interface 313.

As shown in the depicted embodiment, output 401 includes a diagram 403 of a transformer to be constructed in accordance with the teachings of the present invention. Associated with the transformer in output 401 is specific detailed information that can be used when constructing the transformer illustrated in diagram 403. For example, as illustrated in the depicted embodiment, output 401 may include a core information report 405, a bobbin information report 407, a primary winding report 409, a bias winding report 411 and a shield information report 413 in FIG. 4. Each of the reports includes detailed information or parameters helpful to a power supply designer to construct the designed transformer in accordance with the teachings of the present invention.

For example, in one embodiment, core information report 405 includes information regarding core type, core material, gap length, gapped effective inductance and primary inductance. Bobbin information report 407 includes a bobbin reference number, number of primary pins, number of secondary pins, as well as margins on the left and right. Primary winding report 409 includes parameters for the associated sections regarding number of turns, wire size, filar, layers, start pin and termination pin. For the purposes of this disclosure the term filar may be interpreted as a representation of the number of parallel strands of wire. Bias winding report 411 includes parameters and associated values regarding number of turns, wire size, filar, layers, start pin and termination pin. Shield information report 413 includes parameters associated with the primary shield, secondary shield and cancellation shield windings regarding number of turns, wire size, filar, layers, start pin and termination pin, if applicable.

FIG. 5 is a diagram illustrating additional information that may be reported in an embodiment of the output 401, which is generated by an embodiment of a transformer construction design tool in accordance with the teachings of the present invention. As shown in the diagram of FIG. 5, one embodiment of output 401 may also include a secondary winding report 515 and a winding instruction report 517 in accordance with the teachings of the present invention. In the depicted embodiment, secondary winding report 515 includes parameters for the associated outputs regarding number of turns, wire size, filar, layers, start pin and termination pin. Winding instructions report 517 include one embodiment of specific detailed instructions on exactly how to wind each of the specific windings in the sections of the transformer including for example, primary section 1, bias winding, secondary winding, each of the shield windings (primary shield, secondary shield and cancellation shield) and primary section 2. In one embodiment, winding instruction report 517 may also include instructions on how to construct the core as well as how to varnish the transformer.

FIG. 6 is a diagram illustrating additional information that may be reported in an embodiment of the output 401, which is generated by an embodiment of a transformer construction design tool in accordance with the teachings of the present invention. As shown in the diagram of FIG. 6, one embodiment of output 401 may also include comments report 619 regarding the transformer construction, a materials report 621 and an electrical test specification report 623 in accordance with the teachings of the present invention. In the depicted embodiment, comments report 619 may include helpful suggestions regarding the construction of the specific transformer that is described. Materials report 621 provides a detailed list of the materials that will be used to construct the transformer and the electrical test specifications report 623 provides a list of parameters, conditions and specifications of the specific transformer to be constructed in accordance with the teachings of the present invention.

Figure 7:
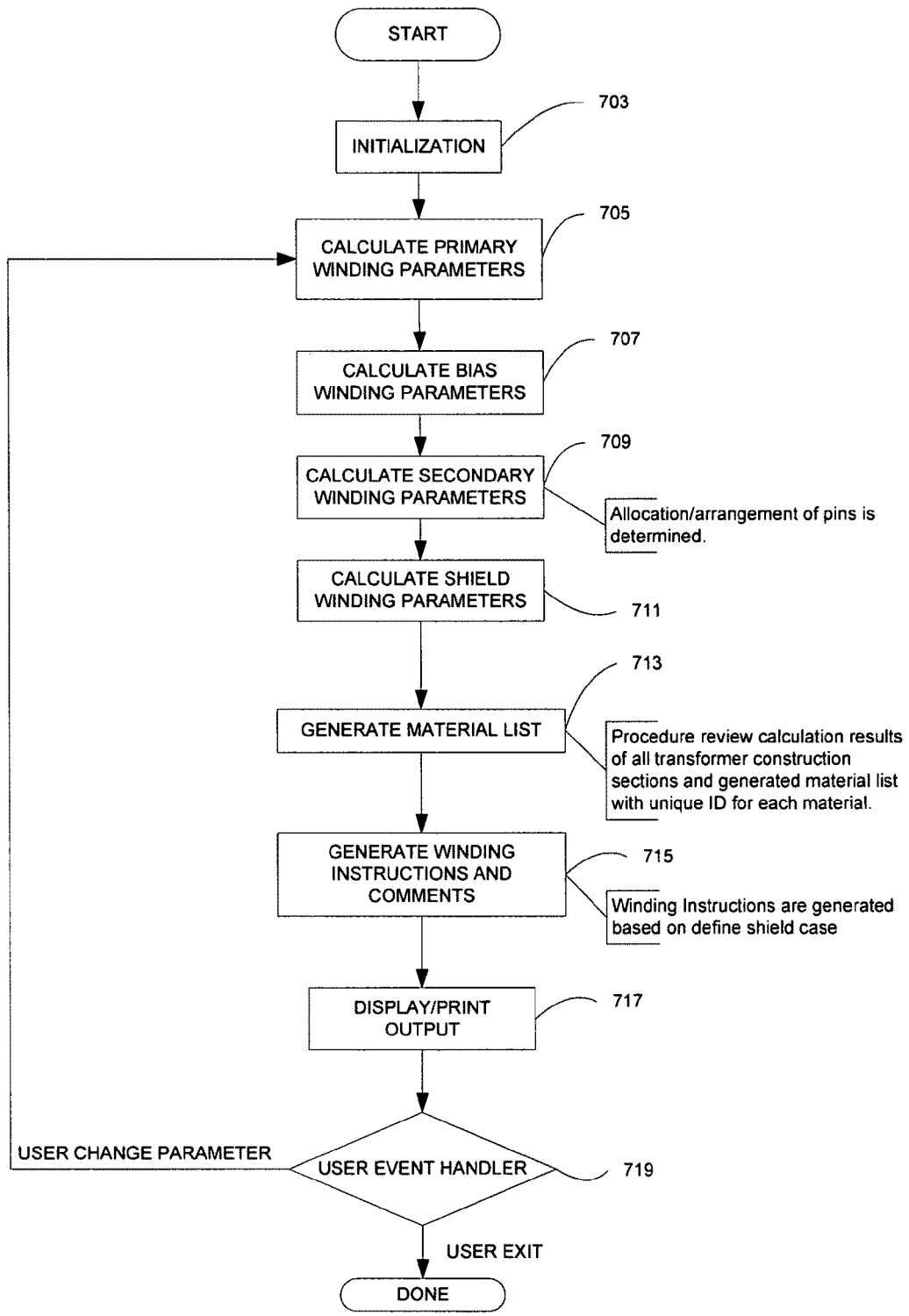
FIG. 7 is a flowchart diagram illustrating one embodiment of a flow of events in an embodiment of a transformer construction design tool in accordance with the teachings of the present invention.

FIG. 7 is a flowchart diagram illustrating one embodiment of a process or flow of events 701 in an embodiment of a transformer construction design tool in accordance with the teachings of the present invention. In one embodiment, a software power supply design tool executed on a computer is run prior to the processing illustrated in the flow of events 701 such that a power supply design is generated by the power supply design tool. In one embodiment, the generated power supply design includes a transformer to be designed and constructed in accordance with the teachings of the present invention. In one embodiment, the generated power supply design is stored on a computer-readable medium, such as for example a storage device like storage element 311 or memory 305 or a storage device accessible in network 313 in FIG. 3. In another embodiment, the generated power supply design may be output from the computer via printer connected to the computer via communications interface 313 or input/output controller 315 or a display 319 via display controller 309. In one embodiment, the processing described in FIG. 7 and subsequent figures may be performed with a software tool executed by the same or a different computer that executes the power supply design tool program that generated the power supply design in accordance with the teachings of the present invention.

In the embodiment illustrated in FIG. 7, processing begins at block 703 with initialization of the transformer construction design tool. After initialization, block 705 shows that primary winding parameters of the designed transformer are calculated. Next, processing may continue with block 707, which shows that bias winding parameters are calculated. After bias winding parameters are calculated, block 719 shows that secondary winding parameters are calculated.

Next, processing may continue with block 711, which shows that shield winding parameters are then calculated. As will be discussed, a variety of operations are performed during the calculation of the parameters of the various transformer windings. For instance, in various embodiments, the allocation of the respective windings on the appropriate number of pins on a given transformer bobbin is determined in accordance with the teachings of the present invention. This allocation of the respective windings on the appropriate number of pins may be performed on one or more of the primary, bias, secondary and/or shield windings in accordance with the teachings of the present invention.

After the parameters of the windings have been calculated, processing may continue with block 713, which shows that a material list is then generated. In one embodiment, calculation results of all of the transformer sections may be reviewed in block 713 and a material list is generated with a unique identifier for each material. Next, processing may continue with block 715, which shows that winding instructions and comments are generated. In one embodiment, the winding instructions generated in block 715 are generated based at least in part on the particular shield case as calculated in block 711. Block 717 shows that the output or a report of an embodiment of a transformer construction design tool may then be displayed or generated. After the output is displayed, block 719 shows that control may then return back to block 705 if there is a user event with a parameter change. If there is a "User Exit" user event, processing is then complete in the flow of events 701 in accordance with the teachings of the present invention.

Figure 8:
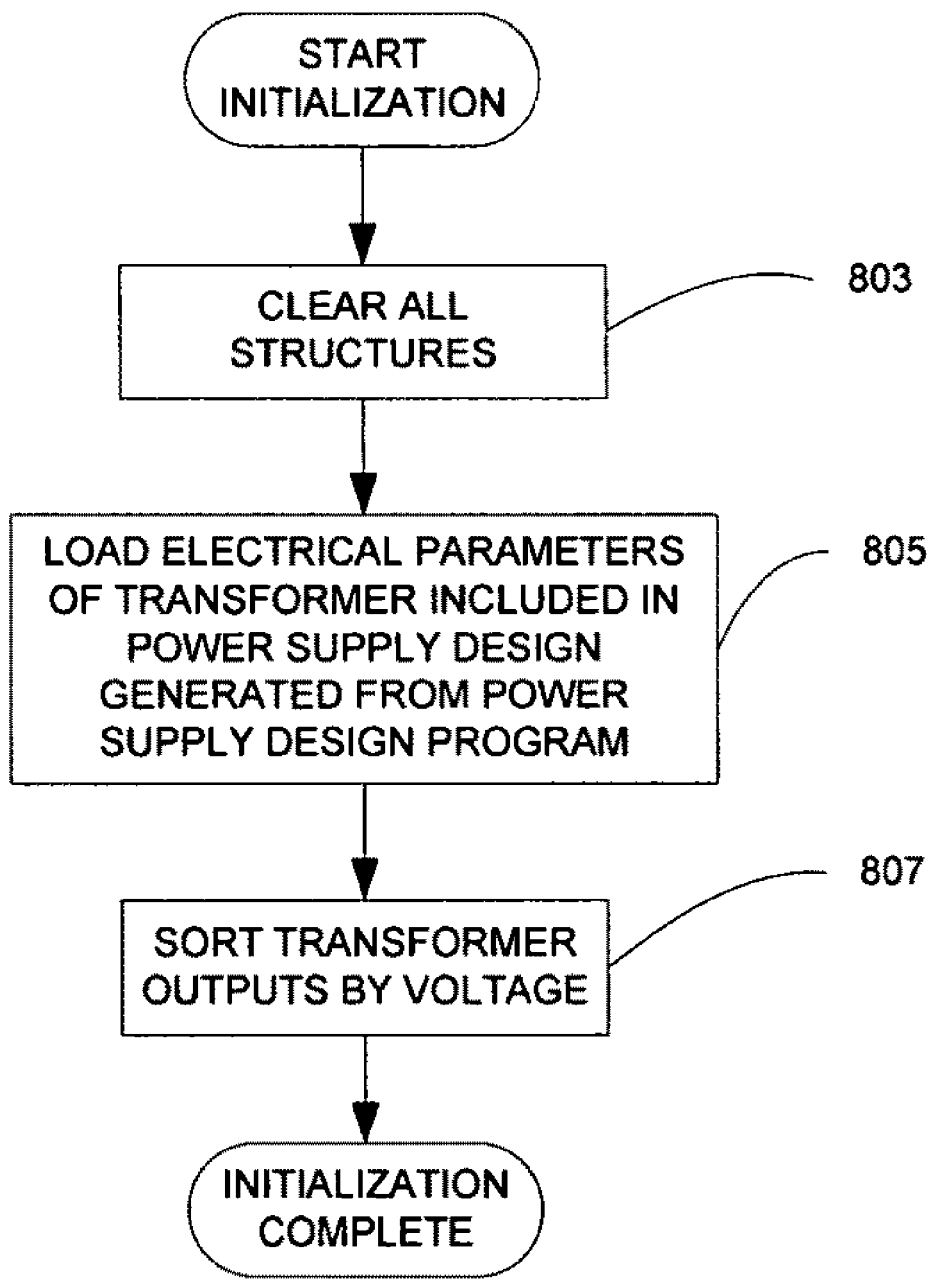
FIG. 8 is a flowchart diagram illustrating one embodiment of a flow of events of an initialization of an embodiment of a transformer construction design tool in accordance with the teachings of the present invention.

FIG. 8 is a flow diagram illustrating one embodiment of a flow of events of the initialization in block 703 in an embodiment of a transformer construction design tool in accordance with the teachings of the present invention. In one embodiment, initialization includes clearing all engine structures of the design tool, as shown with block 803. Block 805 shows that parameters of the transformer design are then loaded. In one embodiment, the parameters that are loaded include for example parameters of the transformer that may be stored in a file in or on storage 311 generated by a power supply design tool in accordance with the teachings of the present invention. In another embodiment, the parameters of the transformer may be loaded into the transformer construction design tool through other suitable techniques, such as for example in a communications signal 323 and/or 325 received through communications interface 313 or through an input device 317 through input/output controller 315. After the parameters are loaded, block 807 shows that the parameters are then organized or sorted, for example by voltage, by the transformer construction design tool in accordance with the teachings of the present invention. In one embodiment, negative output is separated from other output such that negative output doesn't participate in the sorting of block 807.

Figure 9:
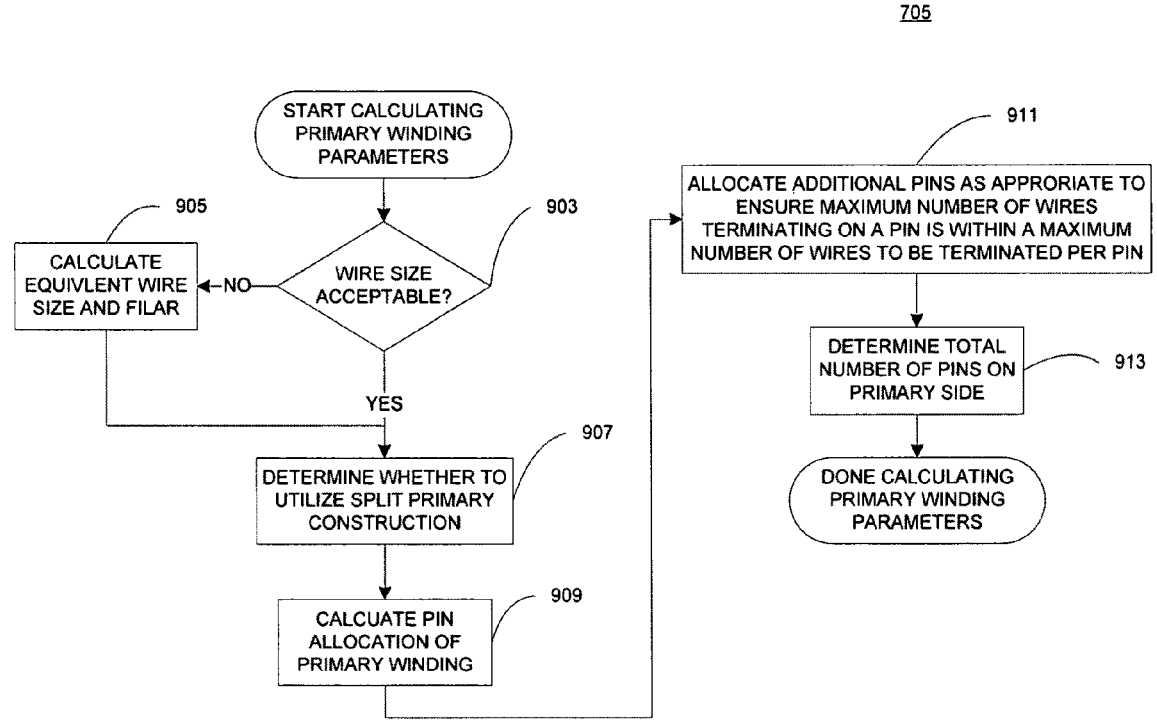
FIG. 9 is a flowchart diagram illustrating one embodiment of a flow of events in a calculation of primary winding parameters in an embodiment of a transformer construction design tool in accordance with the teachings of the present invention.

FIG. 9 is a flow diagram illustrating one embodiment of a flow of events occurring during the calculation of primary winding parameters of block 705 in an embodiment of a transformer construction design tool in accordance with the teachings of the present invention. Block 903 shows that it is determined whether the primary wire size is acceptable. For example, in one embodiment, the biggest primary wire size is 20 American Wire Gauge (AWG). If the wire gauge is not acceptable, block 905 shows that an equivalent wire size and filar is calculated. In one embodiment, the equivalent wire size is calculated based on one or more of a specific winding, a topology of the power supply and a switching frequency of the power supply designed by the power supply design program. Block 907 shows that it is determined if there is a split or sandwich primary construction. Block 909 shows that primary pin allocation is calculated. Block 911 shows that in one embodiment additional pins are allocated if necessary to ensure that the maximum number of wires terminating on or coupled to a pin is practical or within a predetermined maximum number of wires allowable to be coupled to a pin. In one embodiment, the order in which windings are coupled to each pin of the transformer is also determined. In one embodiment, the identity of the particular windings of the transformer that are to be terminated on particular pins of the transformer are determined during the processing within blocks 909 and/or 911 in accordance with the teachings of the present invention. Block 913 shows that the total number of pins on the primary side is then determined. In one embodiment, the total number of pins required is based at least in part on the number of wires terminated on a pin.

Figure 10:
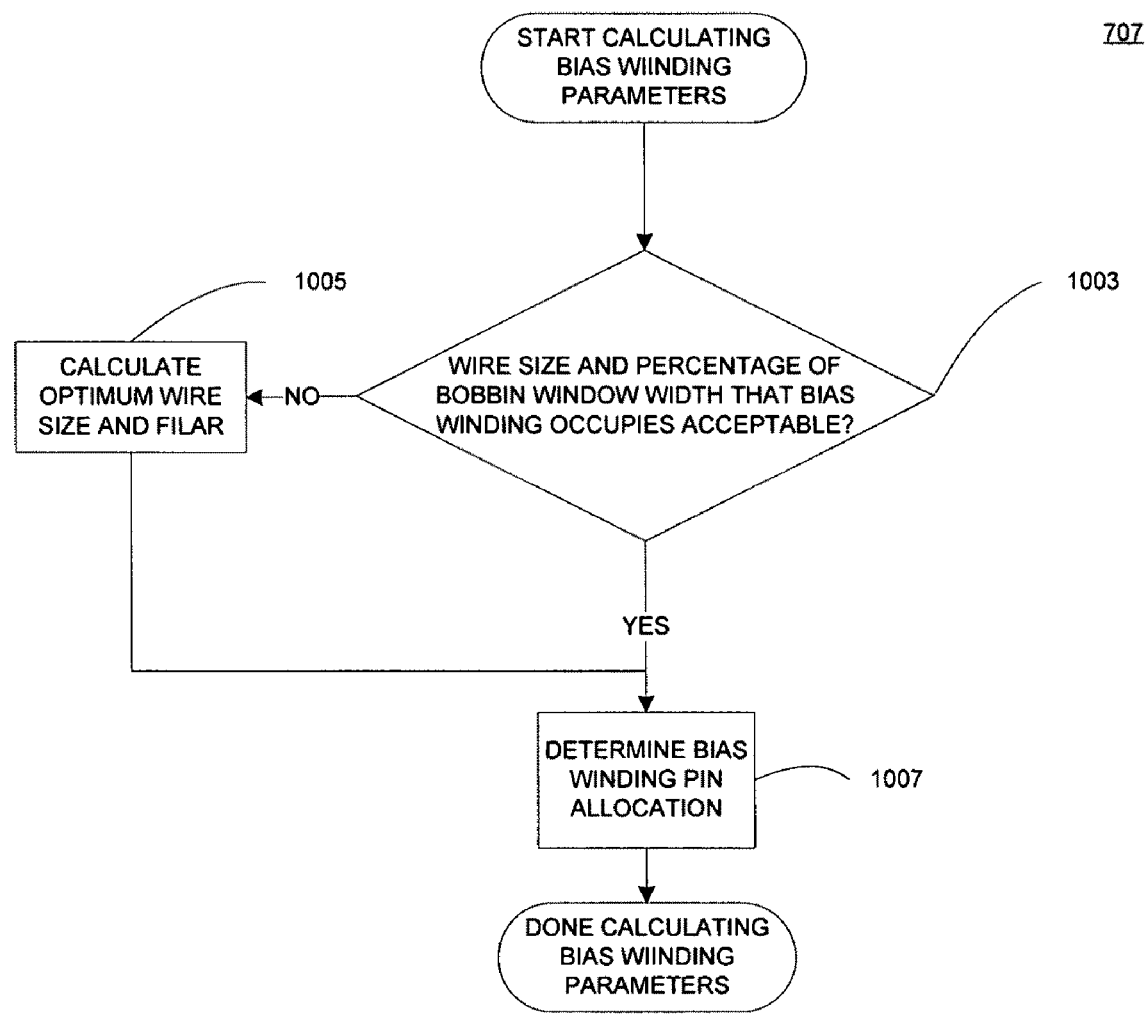
FIG. 10 is a flowchart diagram illustrating one embodiment of a flow of events in a calculation of bias winding parameters in an embodiment of a transformer construction design tool in accordance with the teachings of the present invention.

FIG. 10 is a flow diagram illustrating one embodiment of a flow of events during a calculation of bias winding parameters of block 707 in an embodiment of a transformer construction design tool in accordance with the teachings of the present invention. Block 1003 checks if the wire size and percentage of the bobbin window width that the bias winding occupies is acceptable. In one embodiment, if one of the parameters is not acceptable block 1005 will calculate an optimum or improved wire size and filar. In one embodiment, the transformer construction design tool also tries to optimize bias layers. In one embodiment, optimum bias layers are between 0.5 and 1.0. Block 1007 shows that the transformer construction design tool also determines bias winding pin allocation in accordance with the teachings of the present invention.

Figure 11:
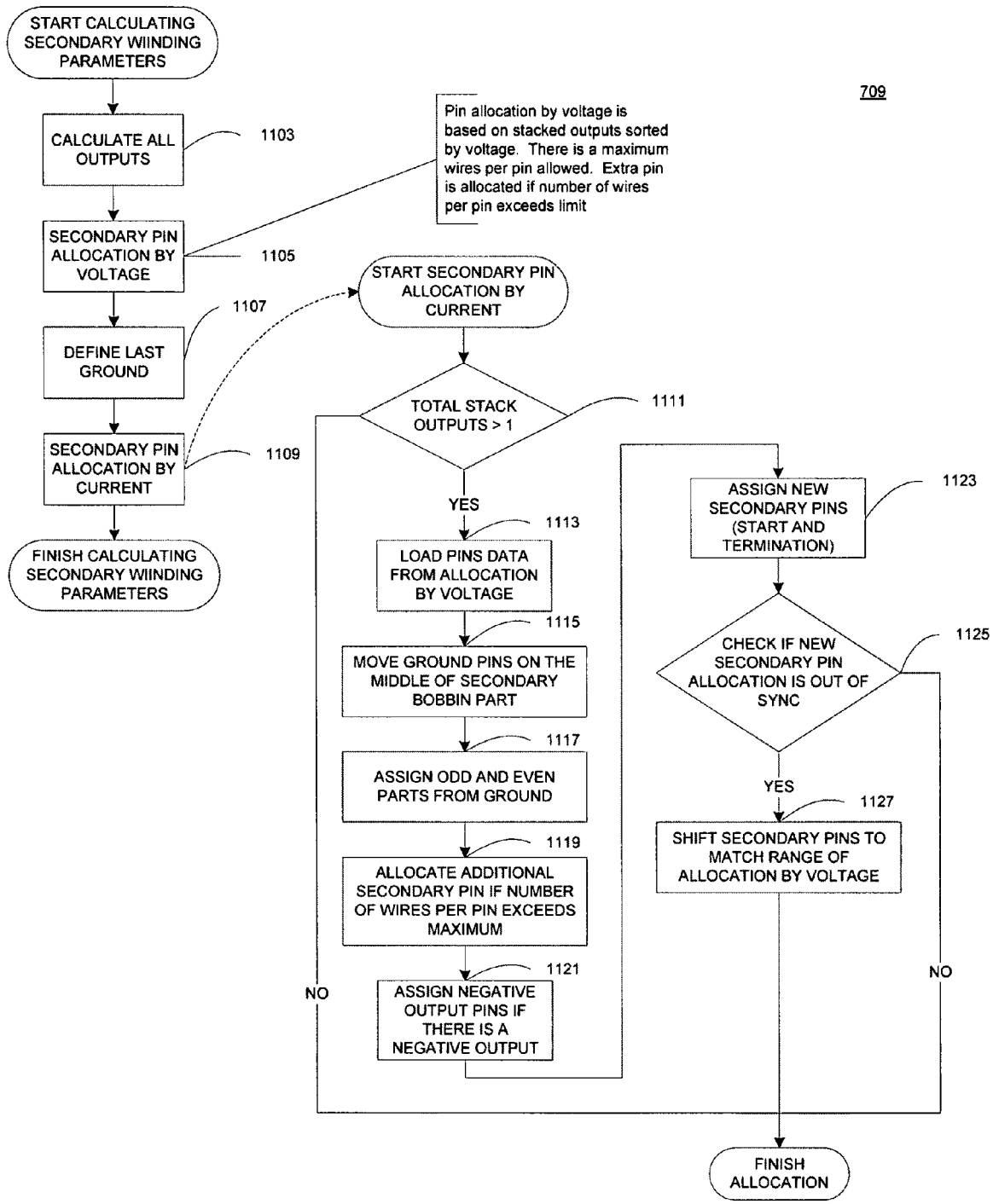
FIG. 11 is a flowchart diagram illustrating one embodiment of a flow of events in a calculation of secondary winding parameters in an embodiment of a transformer construction design tool in accordance with the teachings of the present invention.

FIG. 11 is a flow diagram illustrating one embodiment of a flow of events during a calculation of secondary winding parameters of block in an embodiment of a transformer construction design tool in accordance with the teachings of the present invention. Block 1103 shows that all outputs of the transformer are identified or calculated. Block 1105 shows that secondary pins are then allocated by voltage. In one embodiment, pin allocation is based on stacked outputs sorted by voltage, with stacked outputs being outputs where the start of one winding is connected to the finish of a previous winding or rectified output of a previous winding. In one embodiment, there is a maximum wires per pin allowed and an extra pin is allocated if the number of wires allocated to a pin exceeds the predetermined limit. In one embodiment, the first secondary pin is based on the last pin on the primary side. Block 1107 shows that the ground pin is then defined and block 1109 then shows that secondary pin allocation is determined by current.

In one embodiment, the secondary pin allocation by current of block 1109 begins by determining whether the number of total stack outputs is greater than one, as shown with block 1111. If not, the outputs are independent or it is a single output and the secondary pin allocation by current isn't required. However, if the total of stack outputs is greater than one, then block 1113 shows that pin allocation data is then loaded from the allocation by voltage determined in block 1105. Block 1115 shows that ground pins are then moved on the middle of the secondary bobbin part. In block 1117, all valid outputs are then assigned to odd (e.g. physically located above ground pin) or even parts (e.g. physically located below the ground pin) from the ground pin. Next, all valid outputs are considered and it is determined if additional secondary pins are needed by checking if the number of wires per pin exceeds a predetermined limit or the maximum wires per pin allowed. If additional pins are required, then they are inserted at the defined location. Block 1121 shows that negative output pins are assigned if negative output exists. Block 1123 shows that the new secondary start and termination pins are then assigned. Block 1125 shows that it is checked if the new secondary pin allocation is out of sync, i.e. if during the process of extra pin allocation the first secondary pin or combination of any of the secondary pins have shifted. If this is so, then all of the pins are shifted in the correct direction so as to synchronize the first secondary pin with the calculated value during the process of output pin allocation by voltage, as shown with block 1127. Then, the calculation of secondary winding parameters of the transformer design is completed in accordance with the teachings of the present invention.

Figure 12:
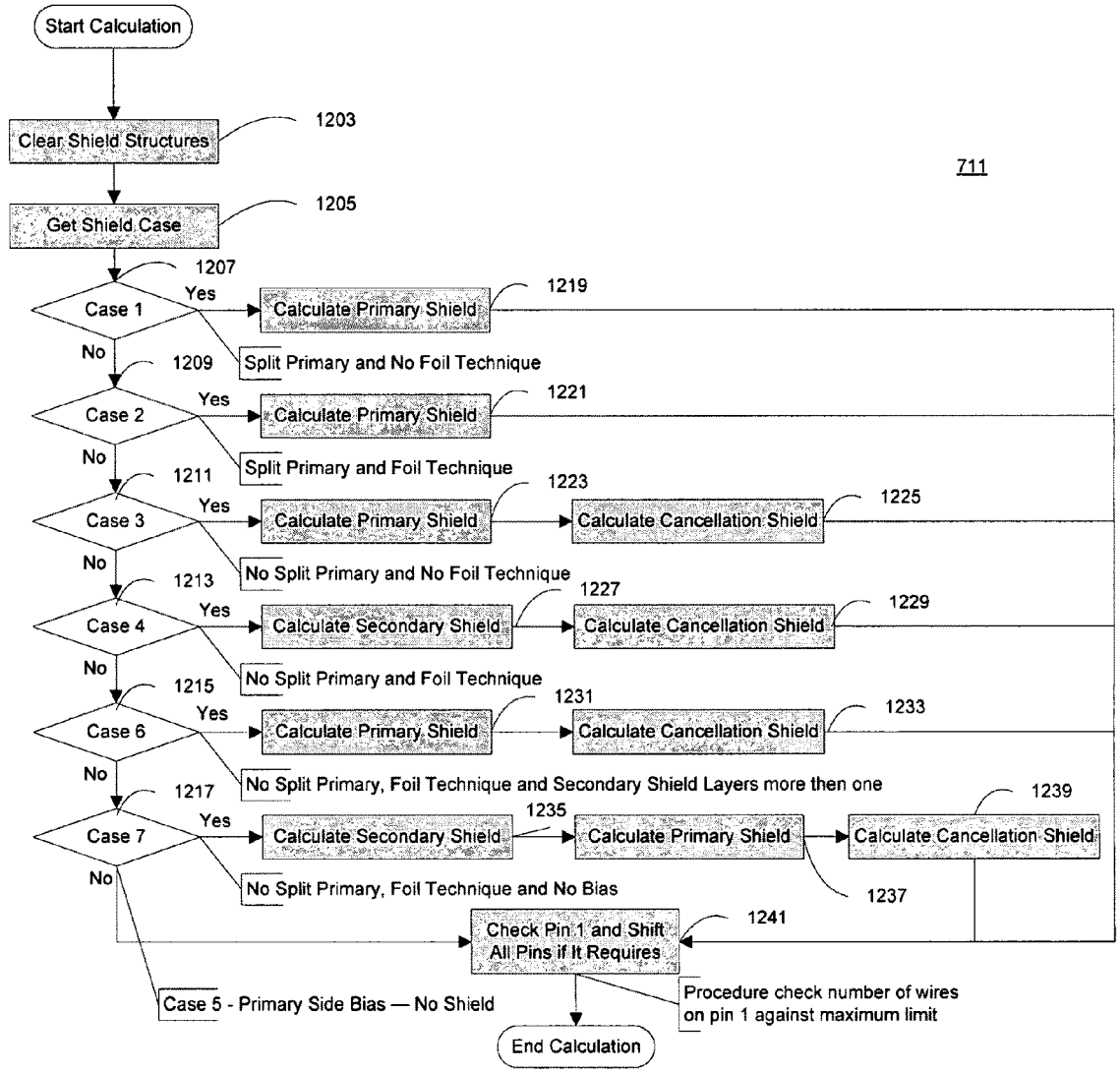
FIG. 12 is a flowchart diagram illustrating one embodiment of a flow of events in a calculation of shield winding parameters in an embodiment of a transformer construction design tool in accordance with the teachings of the present invention.

FIG. 12 is a flowchart diagram illustrating one embodiment of a flow of events during a calculation of shield winding parameters of block 711 in an embodiment of a transformer construction design tool in accordance with the teachings of the present invention. Block 1203 shows that initialization occurs when the calculation of shield winding parameters begins with the clearing of shield structures. As will be shown, in one embodiment, all shield calculations are based on a particular shield "case" of the transformer to be constructed. In one embodiment, these shield cases are derived through complex consideration of electrical parameters that may include variables like type of device used, number of turns, layers, filar, output power, output voltage or current, whether split (sandwich) primary type of construction is used or not used and the type of secondary winding used (wire or foil). Depending on the combination existing in a particular design a shield case is intelligently assigned to it.

For instance, block 1207 determines whether the shield design of the transformer to be constructed falls under a first shield case where there is a split (sandwich) primary with no foil technique. If so, the primary shield is calculated in block 1219 according to this first shield case. In one embodiment, the user is also advised that the design may be able to perform better with the addition of a flux band around the core.

If the shield design of the transformer to be constructed does not fall under the first shield case, then block 1209 determines whether the shield design of the transformer to be constructed falls under a second shield case where there is a split (sandwich) primary with a foil technique. If so, the primary shield is calculated in block 1221 according to this second shield case. In one embodiment, this design of primary shield may or may not vary from the first case. In one embodiment, the user is also advised that the design may be able to perform better with the addition of a flux band around the core.

If the shield design of the transformer to be constructed does not fall under the first or the second shield case, then block 1211 determines whether the shield design of the transformer to be constructed falls under a third shield case where there is no split (sandwich) primary and no foil technique. If so, the primary shield is calculated in block 1223 and the cancellation shield is calculated in block 1225 according to this third shield case. In one embodiment, the primary shield design may also be different than the design used in the first or the second case.

If the shield design of the transformer to be constructed does not fall under the first or second or the third shield case, then block 1213 determines whether the shield design of the transformer to be constructed falls under a fourth shield case where there is no split (sandwich) primary but there is a foil technique. If so, the secondary shield is calculated in block 1227 and the cancellation shield is calculated in block 1229 according to this third fourth case. In one embodiment, the cancellation shield design may be different than the design used in the first or the second case. In one embodiment, the user may also be advised that the design may be able to perform better with the addition of a flux band around the core.

If the shield design of the transformer to be constructed does not fall under the first, second, third or fourth shield cases, then block 1215 determines whether the shield design of the transformer to be constructed falls under a sixth shield case where there is no split (sandwich) primary but there is a foil technique and the secondary shield layer is more than one. If so, the primary shield is calculated in block 1231 and the cancellation shield is calculated in block 1233 according to this sixth case.

If the shield design of the transformer to be constructed does not fall under the first, second, third, fourth or sixth shield case, then block 1217 determines whether the shield design of the transformer to be constructed falls under a seventh shield case where there is no split (sandwich) primary but there is a foil technique and there is no bias winding. If so, the secondary shield is calculated in block 1235, the primary shield is calculated in block 1237 and the cancellation shield is calculated in block 1239 according to this seventh case.

If the shield design of the transformer to be constructed does not fall under the first, second, third, fourth, sixth or seventh shield case, then it is assumed that the shield design of the transformer to be constructed falls under a fifth shield case where there is a primary side bias and no shield windings. In this fifth case, and after the flow events described above with regard to all of the first, second, third fourth, sixth and seventh cases, pin 1 is checked and all pins are shifted as required per block 1241. In one embodiment, the number of wires on pin 1 is checked against a maximum limit. Afterwards, the calculation of shield winding parameters is complete in accordance with the teachings of the present invention.

It is appreciated that the operations that have been described above as multiple discrete blocks performed in turn in a manner that may be helpful in understanding various embodiments according to the teachings of the present invention. However, the order in which the blocks are described above should not be construed to imply that these operations are necessarily order dependent or that the operations be performed in the order in which the blocks are presented. Of course, the process blocks described provide examples to describe embodiments of the present invention and other embodiments may be employed in accordance with the teachings of the present invention.

In the foregoing detailed description, the methods and apparatuses of the present invention have been described with reference to a specific exemplary embodiment thereof. It will, however, be evident that various modifications and changes may be made thereto without departing from the broader spirit and scope of the present invention. The present specification and figures are accordingly to be regarded as illustrative rather than restrictive.

What is claimed is:

1. A computer system, comprising:
    a processor;
    a memory operatively coupled to the processor; and
    a storage media operatively coupled to the processor on which instructions are stored, which when executed by the processor perform operations comprising:
        loading parameters of a transformer included in a power supply design;
        calculating primary winding parameters of the transformer in response to the loaded parameters;
        calculating secondary winding parameters of the transformer in response to the loaded parameters;

determining a type of shield case of the transformer in response to the loaded parameters;

calculating shield winding parameters of the transformer in response to the loaded parameters, wherein the shield winding parameters include a number of turns of a shield winding, a wire size of the shield winding, a filar of the shield winding, and a shield winding pin allocation;

generating a winding instructions report that includes a winding order of the shield winding with respect to a primary winding and a secondary winding; and generating a list of transformer construction materials.

2. The computer system of claim 1, wherein execution of the instructions by the processor further performs calculating bias winding parameters of the transformer in response to the loaded parameters.

3. The computer system of claim 1, wherein execution of the instructions by the processor further performs generating winding instructions to be utilized to construct the transformer.

4. The computer system of claim 1, wherein execution of the instructions by the processor further performs generating an output report of the transformer construction design.

5. The computer system of claim 1, wherein calculating the primary winding parameters of the transformer includes calculating an equivalent wire size and filar of a primary winding of the transformer if a wire size of the primary winding included in the parameters of the transformer is unacceptable.

6. The computer system of claim 5, wherein calculating the equivalent wire size and filar of the primary winding includes calculating the equivalent wire size and filar of the primary winding based on one or more of a specific winding, a topology of the power supply and a switching frequency of the power supply described in the loaded parameters.

7. The computer system of claim 1, wherein calculating the primary winding parameters of the transformer includes calculating a pin allocation of a primary winding of the transformer.

8. The computer system of claim 1, wherein calculating the primary winding parameters of the transformer includes determining whether to utilize a split primary winding in the transformer construction design.

9. The computer system of claim 1, wherein calculating the primary winding parameters of the transformer includes determining a total number of pins included in the transformer construction design based on a number of wires terminated per pin in the transformer construction design.

10. The computer system of claim 9, wherein calculating the primary winding parameters of the transformer further includes allocating additional pins in the transformer construction design based on a maximum number of wires to be terminated per pin.

11. The computer system of claim 9, wherein calculating the primary winding parameters of the transformer further includes identifying which windings of the transformer to terminate on each pin of the transformer.

12. The computer system of claim 2, wherein calculating the bias winding parameters of the transformer includes determining a wire gauge of a bias winding of the transformer.

13. The computer system of claim 2, wherein calculating the bias winding parameters of the transformer includes calculating a percentage of a bobbin window width that a bias winding of the transformer is to occupy.

14. The computer system of claim 2, wherein calculating the bias winding parameters of the transformer includes allocating bias winding pins.

15. The computer system of claim 1, wherein calculating the secondary winding parameters of the transformer includes calculating a pin arrangement of a secondary winding of the transformer.

16. The computer system of claim 15, wherein calculating the pin arrangement of the secondary winding of the transformer is based at least in part on whether there are independent or stacked outputs in the transformer.

17. The computer system of claim 15, wherein calculating the pin arrangement of the secondary winding of the transformer includes allocating secondary pins of the transformer by voltage.

18. The computer system of claim 17, wherein allocating the secondary pins of the transformer by voltage includes assigning the secondary pins based on a stacked output sequence sorted by voltage output.

19. The computer system of claim 18, wherein execution of the instructions by the processor further performs allocating an additional secondary pin if a number of wires terminated per pin is unacceptable.

20. The computer system of claim 15, wherein calculating the pin arrangement of the secondary winding of the transformer includes allocating secondary pins of the transformer by current.

21. The computer system of claim 20, wherein allocating the secondary pins of the transformer by current comprises executing the instructions by the processor to further perform:

sorting the secondary pins by current;

moving a ground pin on a middle of a secondary bobbin part of the transformer;

assigning odd and even secondary pins with respect to the ground pin;

allocating an additional secondary pin if a number of wires terminated per pin is unacceptable;

assigning negative output pins if the transformer includes a negative output; and assigning a secondary pin start.

22. The computer system of claim 20, wherein execution of the instructions by the processor further performs shifting secondary pins to match a range of allocation by voltage.

23. The computer system of claim 1, wherein calculating the secondary winding parameters of the transformer includes calculating a wire size for a secondary winding of the transformer.

24. The computer system of claim 1, wherein calculating the secondary winding parameters of the transformer includes calculating an equivalent wire size and filar of a secondary winding of the transformer if a wire size of the secondary winding included in the parameters of the transformer is unacceptable.

25. The computer system of claim 1, wherein determining the type of shield case of the transformer in response to the loaded parameters includes determining whether a primary winding of the transformer is split.

26. The computer system of claim 1, wherein determining the type of shield case of the transformer in response to the loaded parameters includes determining whether a foil technique is utilized in the transformer.

27. The computer system of claim 1, wherein determining the type of shield case of the transformer in response to the loaded parameters includes determining whether there is primary bias feedback in the transformer.

28. The computer system of claim 1, wherein calculating the shield winding parameters of the transformer includes determining whether a calculated shield winding layer width takes up more than a layer of the transformer.

29. The computer system of claim 1, wherein execution of the instructions by the processor further performs allocating secondary pins of the transformer.

30. The computer system of claim 29, wherein allocating the secondary pins of the transformer includes determining how many secondary pins are to be included in the transformer.

31. The computer system of claim 29, wherein allocating the secondary pins of the transformer includes determining how many ground pins are to be included.

32. The computer system of claim 1, wherein execution of the instructions by the processor further performs generating the power supply design with a power supply design software program executed on the computer system, wherein the power supply design is generated prior to loading the parameters of the transformer included in the power supply design.

33. The computer system of claim 32, wherein loading the parameters of the transformer included in the power supply design includes loading the parameters of the transformer by accessing a file stored on the storage media.

34. The computer system of claim 32, wherein the power supply design generated with the power supply design software program includes an integrated circuit power supply controller to be coupled to the transformer.

35. The computer system of claim 1, wherein the instructions are instructions of a transformer construction design software program, and wherein the storage media has other instructions stored thereon of a power supply design software program which when executed by the processor generates the power supply design including the loaded parameters of the transformer.

* * * * *